United States Patent [19]
Harada et al.

[11] Patent Number: 5,565,378
[45] Date of Patent: Oct. 15, 1996

[54] PROCESS OF PASSIVATING A SEMICONDUCTOR DEVICE BONDING PAD BY IMMERSION IN $O_2$ OR $O_3$ SOLUTION

[75] Inventors: Shigeru Harada; Kimio Hagi; Kiyoaki Tsumura, all of Hyogo-ken, Japan

[73] Assignee: Mitsubishi Denki Kabushiki Kaisha, Tokyo, Japan

[21] Appl. No.: 997,833

[22] Filed: Dec. 29, 1992

[30] Foreign Application Priority Data

Feb. 17, 1992 [JP] Japan ................. 4-029506
Aug. 31, 1992 [JP] Japan ................. 4-231846

[51] Int. Cl.⁶ .................. H01L 21/60; H01L 21/228
[52] U.S. Cl. ............. 437/182; 437/183; 437/209; 228/180.5; 257/780
[58] Field of Search ................ 437/198, 209 WB, 437/183, 182; 427/126, 4; 228/180.5, 180.22; 257/737, 738, 780

[56] References Cited

U.S. PATENT DOCUMENTS

| | | | |
|---|---|---|---|
| 4,349,411 | 9/1982 | Okinaka | 156/659.1 |
| 4,368,220 | 1/1983 | Eldridge et al. | 427/255.4 |
| 4,414,040 | 11/1983 | Kvaas | 148/6.3 |
| 4,433,004 | 2/1984 | Yonezawa et al. | 427/38 |
| 4,517,734 | 5/1985 | Rubin | 24/577 |
| 4,749,640 | 6/1988 | Tremont et al. | 430/314 |
| 4,937,055 | 6/1990 | Kittler et al. | 427/126.3 |
| 4,985,310 | 1/1991 | Agarwala et al. | 428/620 |

FOREIGN PATENT DOCUMENTS

| | | |
|---|---|---|
| 0002731 | 7/1979 | European Pat. Off. |
| 0326018 | 8/1989 | European Pat. Off. |
| 0335383 | 10/1989 | European Pat. Off. |
| 3026026 | 1/1981 | Germany |
| 52-32263 | 3/1977 | Japan |
| 54-80679 | 6/1979 | Japan |
| 54-080679 | 6/1979 | Japan |
| 56-116634 | 9/1981 | Japan |
| 58-142533 | 2/1982 | Japan |
| 57-201031 | 12/1982 | Japan |
| 58-33848 | 2/1983 | Japan ............. 437/209 WB |
| 58-57731 | 4/1983 | Japan ............. 437/209 WB |
| 59-150160 | 8/1984 | Japan ............. 437/209 WB |
| 60-186030 | 9/1985 | Japan ............. 437/209 WB |
| 60-26834 | 2/1987 | Japan ............. 437/209 WB |
| 62-147754 | 7/1987 | Japan ............. 437/209 WB |
| 63-269541 | 7/1988 | Japan |
| 63-216352 | 9/1988 | Japan ............. 437/210 |
| 63-29541 | 11/1988 | Japan |
| 364926 | 3/1991 | Japan ............. 437/183 |
| 3-295247 | 12/1991 | Japan |

*Primary Examiner*—George Fourson
*Assistant Examiner*—David E. Graybill
*Attorney, Agent, or Firm*—Lowe, Price, LeBlanc & Becker

[57] ABSTRACT

A passive state film is formed on a surface of a bonding pad as follows: A silicon substrate 71 is immersed in solution continuously supplied with ozone. Since ozone is continuously supplied, it is possible to maintain the concentration of the dissolved ozone in the solution above a predetermined concentration. Therefore, it is possible to make the speed of formation of the passive state film higher than the speed of fusion of aluminum, which is a main constituent of the bonding pad. Accordingly, it is possible to form a passive state film with no pinholes.

20 Claims, 17 Drawing Sheets

TIME(min) OF PROCESSING IN OZONE ADDED WATER

CONCENTRATION(mg/$\ell$) OF DISSOLVED OZONE IN OZONE ADDED WATER

FIG. 17(a)
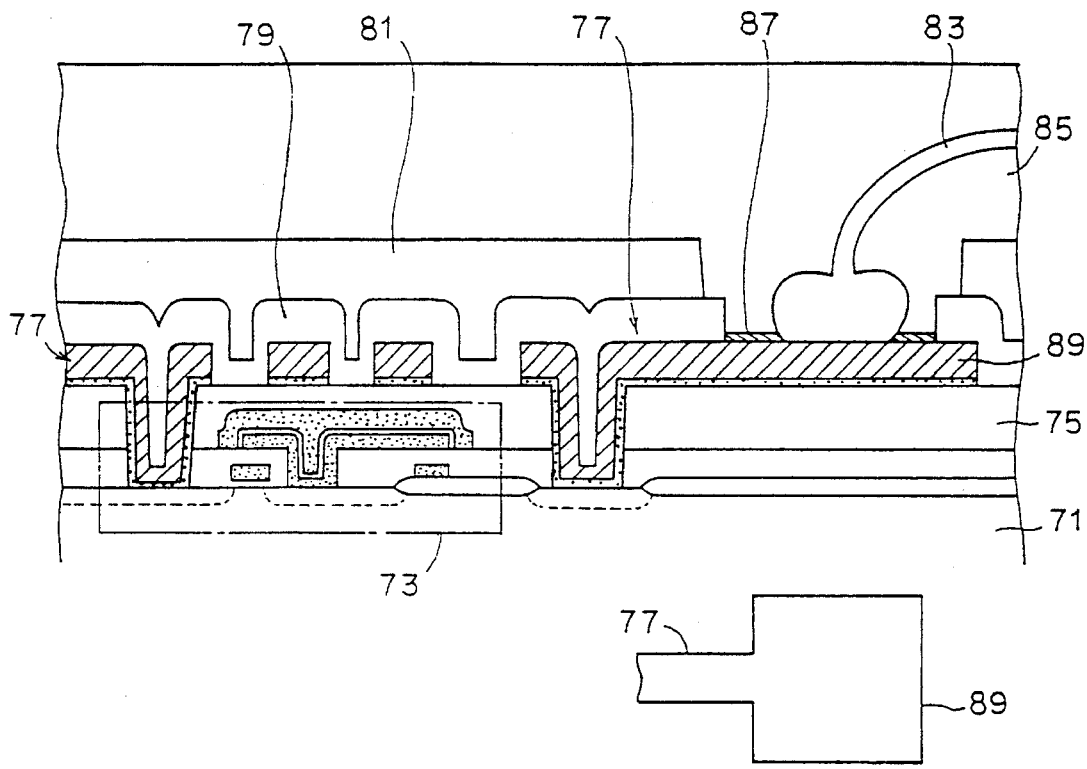
FIG. 17(b)
FIG. 18
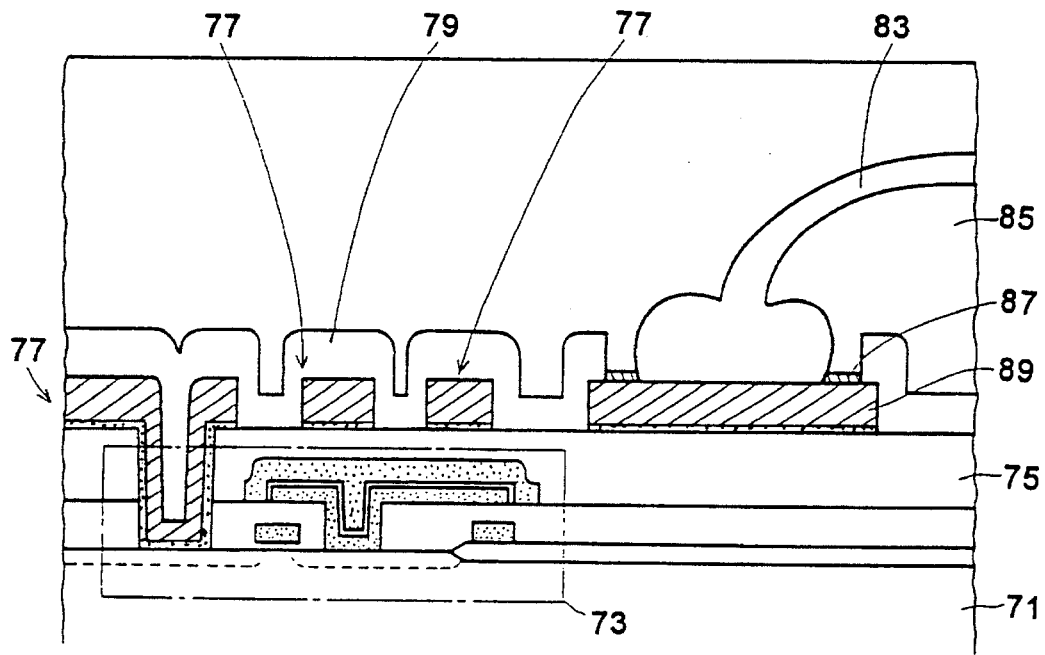

53  59  55  57

5,565,378

PROCESS OF PASSIVATING A SEMICONDUCTOR DEVICE BONDING PAD BY IMMERSION IN $O_2$ OR $O_3$ SOLUTION

BACKGROUND OF THE INVENTION

1. Field of the Invention

The present invention relates to a method of manufacturing a semiconductor device including a bonding pad and, more particularly, to a method of manufacturing a semiconductor device including a bonding pad having a main surface on which a passive state film is formed and the semiconductor device.

2. Description of the Background Art

A semiconductor device includes a number of semiconductor elements formed on a semiconductor substrate. Each of the semiconductor elements is electrically connected through an interconnection layer to a bonding pad. Wire bonding is one of the methods of electrically connecting the bonding pad and external wiring.

FIG. 23 is a typical diagram of a semiconductor device in which wire bonding is performed. Bonding pads 11 are formed on a main surface of a silicon substrate 1. Each of bonding pads 11 is electrically connected through a bonding wire 7 to an external lead 5. Silicon substrate 1 is fixed on a die pad 3, Silicon substrate 1 is sealed with a resin 9.

FIG. 24 is an enlarged cross sectional view of a part A in FIG. 23. A DRAM (Dynamic Random Access Memory) element 13 is formed on the main surface of silicon substrate 1. A first insulating film 15 is formed to cover DRAM element 13. First interconnection films 17 and bonding pad 11 are formed on first insulating film 15. First interconnection films 17 and bonding pad 11 are formed at the same time by patterning a conductive film formed on first insulating film 15. One of first interconnection films 17 is electrically connected, through a contact hole 29 formed in first insulating film 15, to DRAM element 13.

Each of first interconnection films 17 is of a layered structure including an aluminum alloy film 23 and a barrier metal film 25. Aluminum alloy film 23 is formed of aluminum with silicon, copper, or the like added thereto. Barrier metal film 25 is formed of titanium nitride (TiN), titanium tungsten (TiW), or the like. Barrier metal film 25 underlies aluminum alloy film 23 and prevents the aluminum from invading silicon substrate 1 due to sinter so as to prevent an alloy spike phenomenon.

A surface protecting film 19 is formed on first interconnection films 17 and bonding pad 11. A buffer coat film 21 is formed on surface protecting film 19. Buffer coat film 21 is formed for the purpose of protecting the semiconductor element from the stress of resin 9. An opening 27 is formed on main surface 12 of bonding pad 11, and bonding wire 7 is bonded to main surface 12.

A method of manufacturing the semiconductor device illustrated in FIG. 24 will be described in the following. As illustrated in FIG. 25, an element isolating insulating film 43 is formed on a silicon substrate 1. Then, a DRAM element 13 is formed on an exposed part of silicon substrate 1. DRAM element 13 includes a transfer gate electrode 31, an impurity diffused layer 33, a word line 35, a storage node 37, a capacitor insulating film 39, and a cell plate 41.

As illustrated in FIG. 26, a first insulating film 15 is formed on the whole surface of silicon substrate 1. Then, a contact hole 29 is formed on impurity diffused layer 33 using photolithography technique and etching technique.

Referring to FIG. 27, a barrier metal film 25 and an aluminum alloy film 23 are formed sequentially on first insulating film 15 by sputtering. Then, barrier metal film 25 and aluminum alloy film 23 are patterned using photolithography technique and etching technique to form a bonding pad 11 and first interconnection films 17. Then, a surface protecting film 19 is formed to cover bonding pad 11 and first interconnection films 17. Then, surface protecting film 19 on a main surface 12 of bonding pad 11 is removed using photolithography technique and etching technique to form an opening 45.

As illustrated in FIG. 28, a buffer coat film 21 is formed on surface protecting film 19. Buffer coat film 21 on bonding pad 11 is removed using photolithography technique and etching technique to form an opening 27. Then, silicon substrate 1 is ground from a rear surface of silicon substrate 1 until silicon substrate 1 comes to have a thickness in the range of about 200 μm to about 400 μm. Silicon substrate 1 is cleaned with pure water or the like during the step of grinding silicon substrate 1 and after completion of that step.

As illustrated in FIG. 29, main surface 12 of bonding pad 11 is connected through bonding wire 7 to an external lead (see FIG. 23) by a wire bonding method. Finally, as illustrated in FIG. 30, silicon substrate 1 is sealed with a resin 9.

A semiconductor device completed as described above is actually used; however, since resin 9 does not have the property of completely inhibiting moisture from passing therethrough, it happens that moisture in an external atmosphere invades resin 9. As illustrated in FIG. 31, resin 9 is directly in contact with bonding pad 11 in a part 49. Moisture invading resin 9 corrodes bonding pad 11 from part 49 to cause a corrosion hole 47 to be generated in bonding pad 11. If corrosion hole 47 grows, there is the disadvantage of breaking off the connection between bonding pad 11 and bonding wire 7.

Japanese Patent Laying-Open No. 63-269541 (1988) discloses a semiconductor device in which a passive state film is formed on a bonding pad, which will be described in the following. FIG. 32 is a partial perspective view of a semiconductor device disclosed in Japanese Patent Laying-Open No. 63-269541 (1988). An insulating protective film 59 and a bonding pad 55 of aluminum are formed on a semiconductor substrate 53. Semiconductor substrate 53 in this state is immersed in warm water to form a passive state film ($Al_2O_3$) 57 on bonding pad 55. Then, a bonding wire 51 is bonded through passive state film 57 to bonding pad 55. Since passive state film 57 has the property of not letting moisture therein, it does not happen that moisture externally invading the resin corrodes bonding pad 55.

When a large current stress is applied to a metal, metal atoms move. This phenomenon is referred to as electromigration. If electromigration is generated, local voids are generated in interconnection, so that the resistance of the interconnection is increased, or disconnection occurs. In order to prevent electromigration, an aluminum alloy, which is obtained by adding a metal such as copper or the like to aluminum, is used to form an interconnection layer. The interconnection layer and the bonding pad are formed by patterning a conductive film formed on an insulating film, so that a metal such as copper or the like is also added to the bonding pad.

If a passive state film 67 is formed on a bonding pad formed of an aluminum alloy including copper in accordance with the method of Japanese Patent Laying-Open No. 63-269541, a number of pinholes 69 are generated in passive state film 67 as illustrated in FIG. 33. The reason why pinholes 69 are generated will be described in the following. In FIG. 33, reference numeral 61 denotes a bonding pad, reference numeral 63 denotes aluminum, and reference numeral 65 denotes copper.

FIG. 34 is an enlarged cross sectional view of a part of FIG. 33. Copper is added to aluminum, and a part of the added copper is exposed on the surface of the aluminum. If bonding pad 61 in this state is immersed in warm water to form a passive state film ($Al_2O_3$) 67, so-called local battery action occurs. Specifically, the copper forms a plus Dole, the aluminum forms a minus pole, current flows between the copper and the aluminum, and a part of the aluminum around the copper fuses. Since the part of the aluminum around the copper fuses, passive state film 67 is not formed on the part of the aluminum around the copper, and pinhole 69 is generated. If a number of pinholes are formed in passive state film 67, moisture invading the resin comes into contact with the aluminum in the pinholes and corrodes the aluminum. In addition, while the passive state film preferably has a thickness of 50–200 Å, the local battery action prevented the passive state film from having a thickness of approximately 50–200 Å on the bonding pad with added copper.

The above-described Japanese Patent Laying-Open No. 63-269541 (1988) discloses another method of forming a passive state film, in which a bonding pad is immersed in a hydrogen peroxide liquid. According to this method, a passive state film ($Al_2O_3$) is formed on a bonding pad by a reaction as follows:

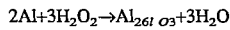

$$2Al + 3H_2O_2 \rightarrow Al_2O_3 + 3H_2O$$

In a case where a hydrogen peroxide liquid is used, the speed of formation of a massive state film is higher than the speed of fusion of aluminum due to the local battery action, so that it is possible to form a passive state film with no pinholes.

However, in a case where a hydrogen peroxide liquid is used, as the reaction proceeds, the hydrogen peroxide concentration becomes lower, and the oxidation power becomes weaker. Therefore, in a part where the passive state film is not formed immediately, the speed of fusion of the aluminum becomes higher than the speed of formation of the passive state film, so that pinholes are generated.

SUMMARY OF THE INVENTION

The present invention has been achieved in order to solve the conventional problems as described above. An object of the present invention is to provide a method of manufacturing a semiconductor device including a bonding pad having a passive state film with no pinholes.

Another object of the present invention is to provide a semiconductor device including a bonding pad having a passive state film with no pinholes.

Still another object of the present invention is to provide a method of forming a passive state film with no pinholes even on a bonding pad including a metal added thereto for enhancing the resistance to electromigration.

According to an aspect of the present invention, a method of manufacturing a semiconductor device includes the step of forming a bonding pad, which is electrically connected to a semiconductor element formed on a semiconductor substrate, on the semiconductor substrate, the step of forming a surface protecting film on the semiconductor substrate so as to expose a main surface of the bonding pad, and the step of immersing the semiconductor substrate in water which is continuously supplied with at least one of ozone and oxygen to form a passive state film on the main surface.

According to this aspect, the water used to form the passive state film is continuously supplied with oxygen or ozone, so that it is possible to maintain the concentration of dissolved oxygen or dissolved ozone in the water above a predetermined concentration. Oxygen and ozone concerned in formation of the passive state film are not oxygen and ozone in the state of foam but dissolved oxygen and dissolved ozone in water. Since it is possible to maintain the concentration of dissolved oxygen or dissolved ozone in water above a predetermined concentration, it is possible to make the speed of formation of the passive state film higher than the speed of fusion of aluminum.

According to another aspect of the present invention, a method of manufacturing a semiconductor device includes the steps of forming a bonding pad on a semiconductor substrate, regulating a flow of an oxidizing gas, continuously dissolving the oxidizing gas in a quantity of solution, immersing the semiconductor substrate in the quantity of solution having the oxidizing gas dissolved therein, and attaching a conductor to the bonding pad.

According to still another aspect of the present invention, a semiconductor device includes a substrate, a bonding pad having a main surface electrically connectable to external wiring and including a metal for enhancing resistance to electromigration, a surface protecting a film formed on the substrate having a hole formed therethrough to expose the main surface of the bonding pad, and a passive state film having a thickness in the range of 50 Å to 200 Å formed on the main surface of the bonding pad.

A semiconductor device according to this aspect of the present invention includes a passive state film having a predetermined thickness formed on a bonding pad to which a metal for enhancing the resistance to electromigration is added. Since the semiconductor device according to this aspect of the present invention is manufactured using the manufacturing method according to the previously described aspect of the present invention, it is possible to make the thickness of the passive state film a predetermined thickness even on a bonding pad to which a metal for enhancing the resistance to electromigration is added. The reason why the predetermined thickness is in the range of 50 Å to 200 Å will be described in description of the preferred embodiments.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 (a) is a partial cross sectional view of a semiconductor device according to a second embodiment of the present invention, and (b) is a plan view of bonding pad 89.

FIG. 18 is a partial cross sectional view of a semiconductor device according to a third embodiment of the present invention.

DESCRIPTION OF THE PREFERRED EMBODIMENTS

Figure 1:
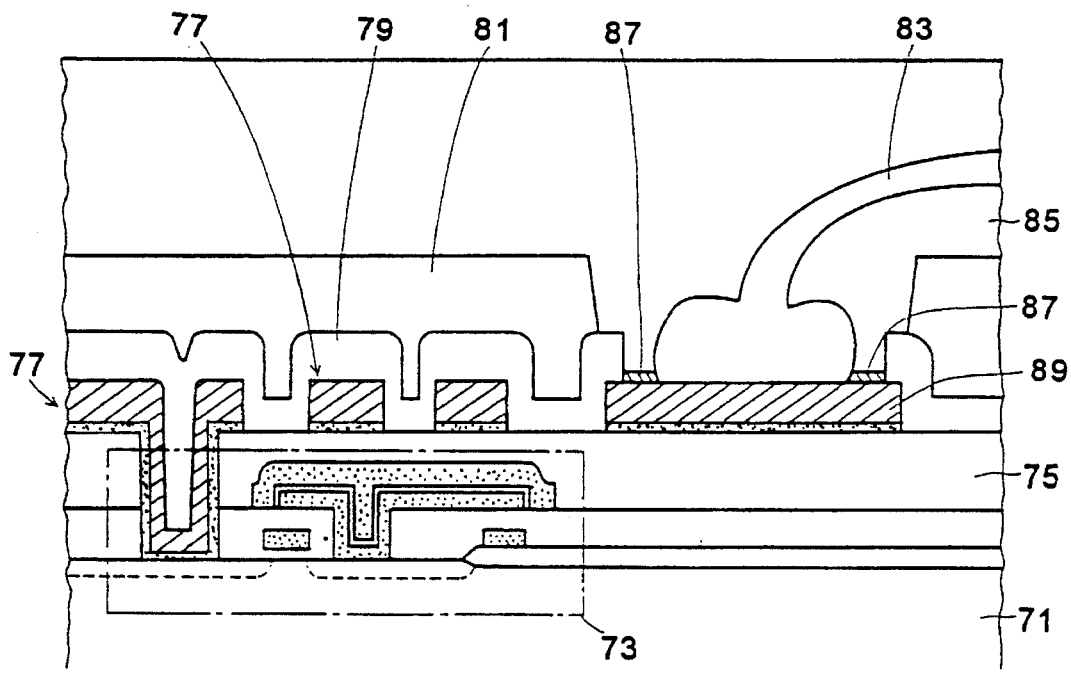
FIG. 1 is a partial cross sectional view of a semiconductor device according to a first embodiment of the present invention.

FIG. 1 is a partial cross sectional view of a semiconductor device according to a first embodiment of the present invention. First interconnection films 77 and a bonding pad 89 are formed on a first insulating film 75. A bonding wire 83 is bonded to bonding pad 89. A passive state film 87 is formed in a gap between a surface protecting film 79 and bonding wire 83. A silicon substrate 71 is covered with resin 85. Reference numeral 73 denotes a DRAM element formed on silicon substrate 71. Reference numeral 81 denotes a buffer coat film.

Figure 2:
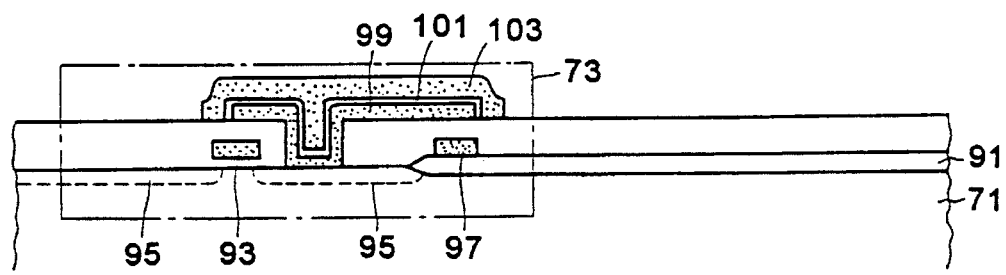
FIG. 2 is a cross sectional view for explaining a first step of a method of manufacturing a bonding pad part according to the first embodiment of the present invention.

A method of manufacturing the bonding pad part of the semiconductor device according to the first embodiment of the present invention will be described in the following. Referring to FIG. 2, first, an element isolating insulating film 91 is selectively formed on a silicon substrate 71. A DRAM element 73 is formed on the exposed part of silicon substrate 71 using a normal method. DRAM element 73 includes a transfer gate electrode 93, an impurity diffused layer 95, a word line 97, a storage node 99, a capacitor insulating film 101, and a cell plate 103.

Figure 3:
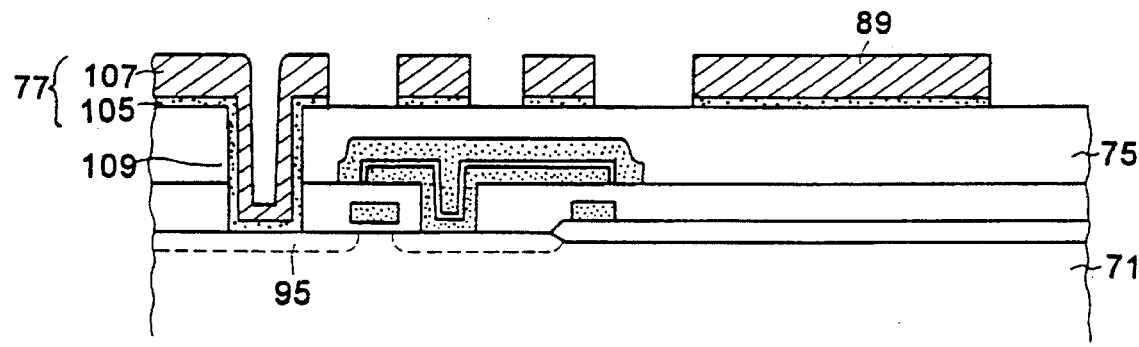
FIG. 3 is a cross sectional view for explaining a second step of the method of manufacturing the bonding pad part according to the first embodiment of the present invention.

As illustrated in FIG. 3, a first insulating film 75 of a silicon oxide film or the like is formed on the whole surface of silicon substrate 71 using a CVD (Chemical Vapor Deposition) method. Then, a through-hole 109 is formed in first insulating film 75 on impurity diffused layer 95 using photolithography technique and etching technique. A barrier metal film 105 and an aluminum alloy film 107 are formed sequentially on first insulating film 75 using a sputtering method. The material of barrier metal film 105 is titanium nitride (TIN) or titanium tungsten (TiW), for example. Aluminum alloy film 107 includes aluminum and at least one material selected from the group consisting of copper (Cu), titanium (Ti), chromium (Cr), magnesium (Mg), scandium (Sc), yttrium (Y), zirconium (Zr), hafnium (Hf), vanadium (V), niobium (Nb), tantalum (Ta), molybdenum (Mo), tungsten (W) and palladium (Pd), which is added to the aluminum. The metal element is added to the aluminum for enhancing the resistance to electromigration. The layered conductive film including barrier metal film 105 and aluminum alloy film 107 is patterned to form first interconnection films 77 and a bonding pad 89.

Figure 4:
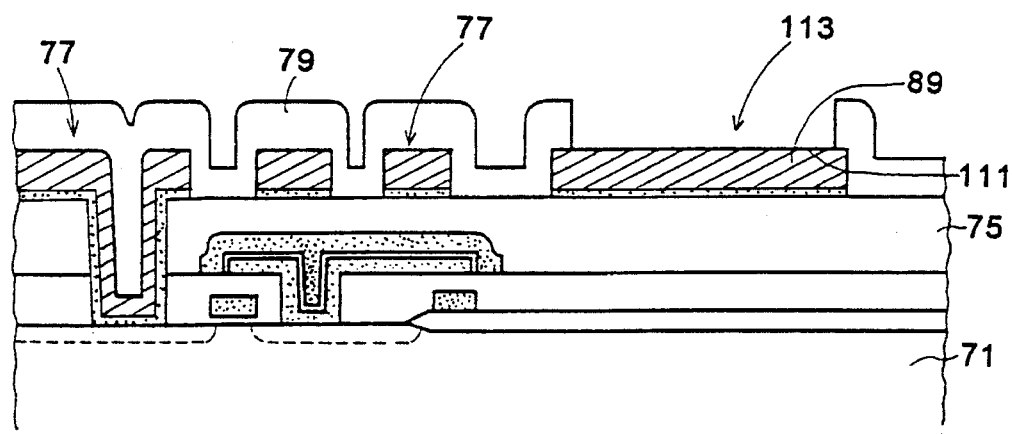
FIG. 4 is a cross sectional view for explaining a third step of the method of manufacturing the bonding pad part according to the first embodiment of the present invention.

As illustrated in FIG. 4, a silicon oxide film to serve as a surface protecting film 79 is formed on the whole surface of silicon substrate 71 by the CVD method using plasma at a temperature in the range of 300° C. to 400° C. with silane (SiH$_4$) gas and nitrous oxide (N$_2$O) gas, for example. A silicon nitride film or a silicon oxide nitride film may be used in place of the silicon oxide film. It is also possible to use a combination of two or more of a silicon oxide film, a silicon nitride film, and a silicon oxide nitride film. A silicon nitride film can be formed by the CVD method using plasma with silane (SiH$_4$) gas and ammonia (NH$_3$) gas, for example. A silicon oxide nitride film can be formed by the CVD method using plasma with silane (SiH$_4$) gas, ammonia (NH$_3$) gas, and nitrous oxide (N$_2$O) gas, for example.

Surface protecting film 79 on a main surface 111 of bonding pad 89 is removed using photolithography technique and etching technique to form an opening 113.

Figure 5:
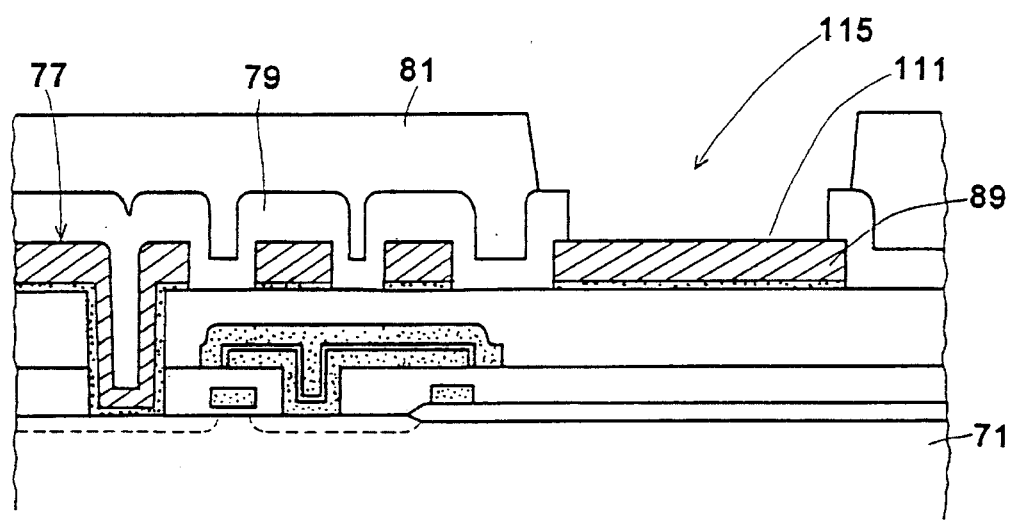
FIG. 5 is a cross sectional view for explaining a fourth step of the method of manufacturing the bonding pad part according to the first embodiment of the present invention.

As illustrated in FIG. 5, a buffer coat film 81 including polyimide resin, silicone resin, or the like is formed on the whole surface of silicon substrate 71. Buffer coat film 81 is formed for the purpose of protecting a semiconductor element from the stress of resin used as a mold. Buffer coat film 81 is formed as follows: Resin is applied on the whole surface of silicon substrate 71 by a spin coating method, for example, and the resin is prebaked at a temperature in the range of about 100° C. to about 150° C. Then, the resin on main surface 111 of bonding pad 89 is removed using photolithography technique and etching technique to form an opening 115. Then, the resin is baked at a temperature in the range of about 300° C. to about 350° C. to complete buffer coat film 81.

Silicon substrate 71 is ground from its rear surface until it comes to have a thickness in the range of about 200 μm to about 400 μm, for example, so that it can be accommodated in a package of a mold resin seal type. Silicon substrate 71 is cleaned with ozone water instead of pure water during the grinding step and after completion of that step.

Figure 6:
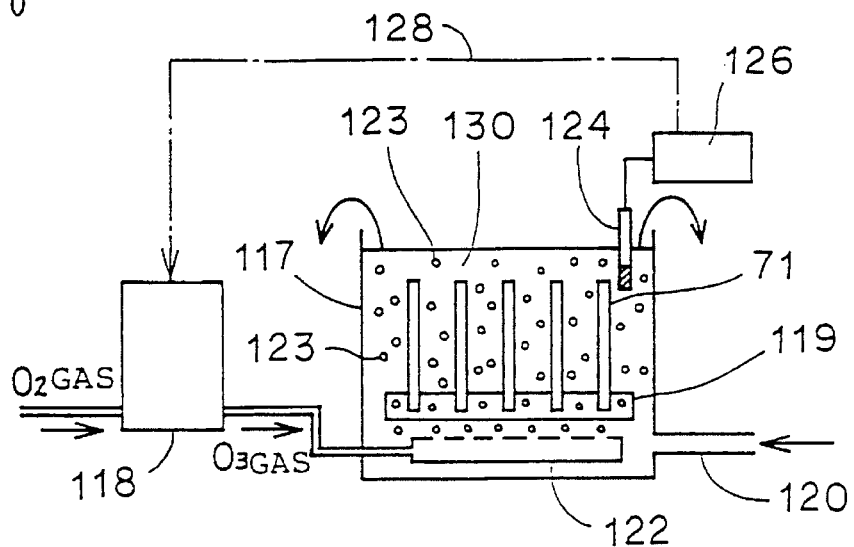
FIG. 6 is a schematic diagram of one embodiment of a passive state film forming device.

Passive state film 87 is formed on bonding pad 89 with ozone water. FIG. 6 is a schematic diagram showing one example of a passive state film forming device. A water tank 117 has a holder 119 having silicon substrate 71 inserted therein. Water tank 117 is supplied with pure water from a pure water supplying tube 120.

Oxygen gas is turned into ozone gas by an ozone gas generator 118, to be supplied to a bubbling machine 122 in water tank 117. Ozone gas is bubbled in bubbling machine 122 and dissolved in pure water, resulting in ozone water 130.

Figure 8:
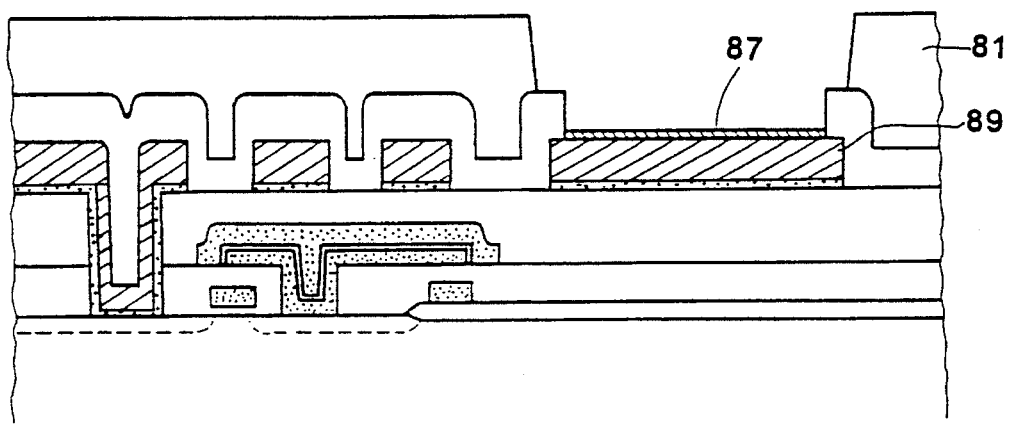
FIG. 8 is a cross sectional view for explaining a fifth step of the method of manufacturing the bonding pad part according to the first embodiment of the present invention.

Silicon substrate 71 was immersed in ozone water 130 for 5–60 minutes. As can be seen in FIG. 8, passive state film 87 composed of Al$_2$O$_3$ was thus formed on bonding pad 89.

With a sensor 124 immersed in the ozone water, a monitor 126 monitored the dissolved ozone concentration in the ozone water to check either the concentration is within the range of predetermined values or not. Monitor 126 and ozone gas generator 118 may be connected as shown by 128 to feed back control the dissolved ozone concentration.

Figure 7:
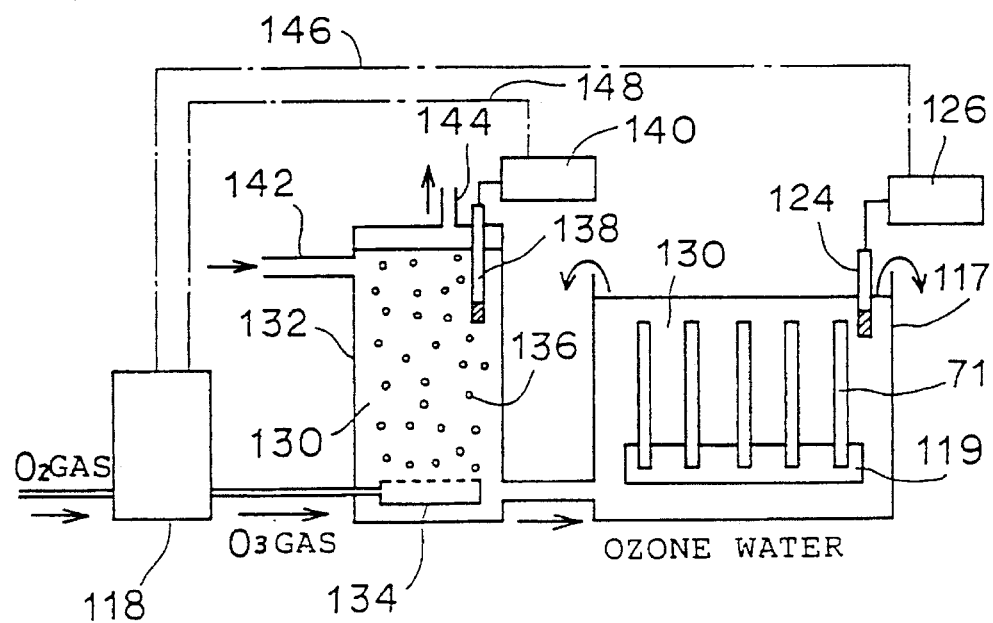
FIG. 7 is a schematic diagram of another example of a passive state film forming device.

Another example of a passive state film generating device is shown in, FIG. 7. In the example, ozone water is previously generated to be supplied to water tank 117.

Oxygen gas is turned into ozone gas by ozone gas generator 118, to be applied to a bubbling machine 134 in an ozone water generating tank 132. Ozone water generating tank 132 is supplied with pure water from a pure water supplying tube 142. The ozone gas is bubbled in a bubbling machine 134, and dissolved in pure water, resulting in ozone water 130. An ozone bubble is shown by 136.

With a sensor 138 immersed in ozone water, the dissolved ozone concentration of ozone water 130 in ozone water generating tank 132 can be monitored by a monitor 140, to check whether it is within the range of predetermined values or not. An exhaust tube is shown by 144.

Ozone water 130 is fed to water tank 117. Water tank 117 has holder 119 having silicon substrate 71 inserted therein. Silicon substrate 71 is immersed in ozone water 130. With sensor 124 immersed in ozone water 130, monitor 126 can monitor the dissolved ozone concentration in ozone water 130 being either within the range of predetermined values or not. Monitor 126 and ozone gas generator 118 may be connected as shown in 146, and monitor 140 and ozone gas generator 118 may be connected as shown in 148, to feed back control the dissolved ozone concentration.

An expression of chemical reaction for forming a passive state film will now be described.

$$2Al + O_3 \rightarrow Al_2O_3 \qquad (1)$$

Not only by the direct reaction between ozone and aluminum as shown in the above expression, most of passive state film is formed by the following reaction.

$$2Al + 3(HO) \rightarrow Al_2O_3 + (3/2)H_2 \qquad (2)$$

HO is hydroxyradical having stronger oxidation power than that of ozone. HO is generated by the following reaction.

$$O_3 + H_2O \rightarrow HO_3^+ + OH^- \qquad (3)$$

$$HO_3^+ + OH^- \rightarrow 2HO_2 \qquad (4)$$

$$O_3 + HO_2 \rightarrow HO + 2O_2 \qquad (5)$$

As shown in (3), ozone is first hydrolyzed. As shown in (4), hydroperoxyradical (HO$_2$) is generated by hydrolization of ozone. Although hydroperoxyradical has weaker oxidation power than that of ozone, hydroxyradical (HO) is generated as shown in (5).

Figure 9:
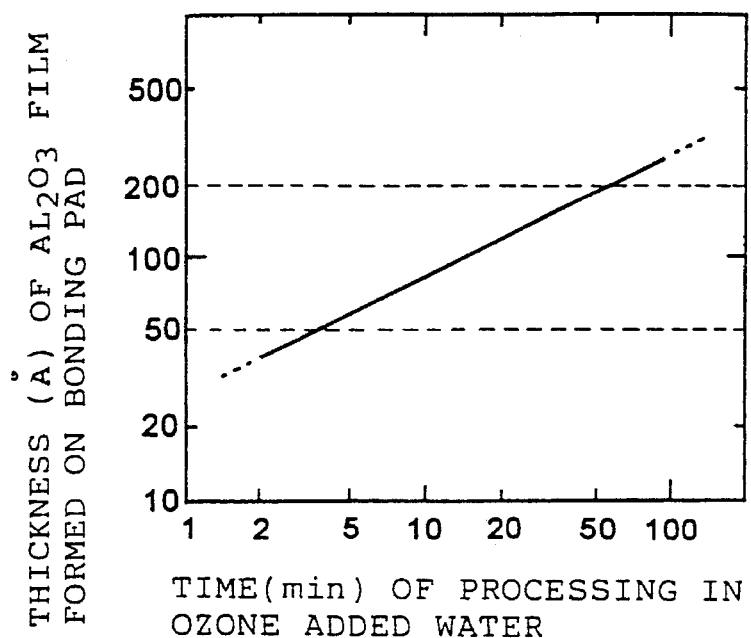
FIG. 9 is a graph showing the relation between the time of processing in ozone added water and the thickness of an $Al_2O_3$ film formed on a bonding pad.

FIG. 9 is a graph showing the relation between the time of processing in ozone added water and the thickness of an Al$_2$O$_3$ film formed on the bonding pad. The dissolved ozone concentration was 2.5 mg/l. As will be seen from FIG. 9, as the time of processing in ozone added water becomes longer, the thickness of the Al$_2$O$_3$ film becomes larger. The thickness of the Al$_2$O$_3$ film is preferably in the range of 50 Å to 200 Å, because, if it is less than 50 Å, it lessens the effect of preventing moisture invading the resin from corroding the bonding pad, and, if it is more than 200 Å, it becomes difficult for a bonding wire to break through the Al$_2$O$_3$ film on the occasion of wire bonding.

Figure 10:
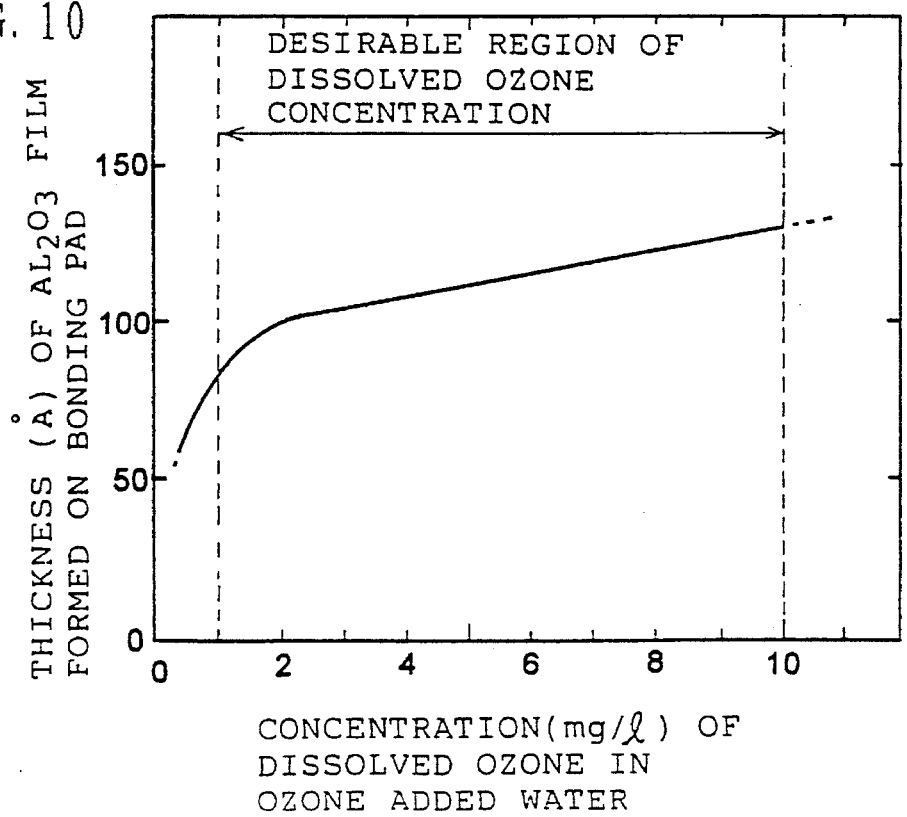
FIG. 10 is a graph showing the relation between the concentration of dissolved ozone in ozone added welter and the thickness of an $Al_2O_3$ film formed on a bonding pad.

FIG. 10 is a graph showing the relation between the concentration of dissolved ozone in ozone added water and the thickness of an Al$_2$O$_3$ film formed on the bonding pad. The bonding pad was immersed in the ozone added water for 15 minutes. The concentration of dissolved ozone in the ozone added water is preferably in the range of 1 mg/l to 10 mg/l, because, if it is less than 1 mg/l, the slope of the line in the graph is large to make it not possible to form an Al$_2$O$_3$ film having a desired thickness stably, and because 10 mg/l is the upper limit of the amount of dissolved ozone in pure water.

Figure 11:
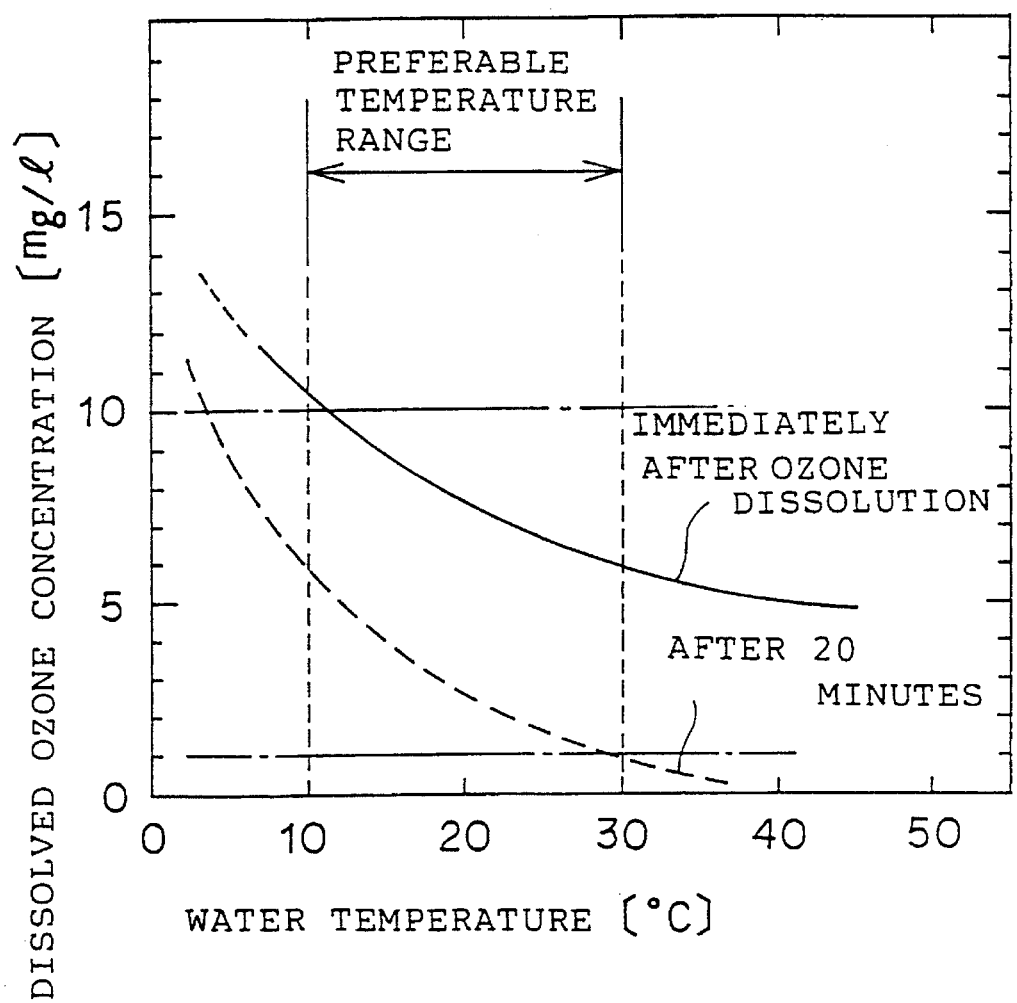
FIG. 11 is a graph showing the relation between water temperature and the concentration of dissolved ozone.

FIG. 11 is a graph showing the relation between water temperature and the dissolved ozone concentration. A solid line indicates the relation immediately after ozone is dissolved therein, while a dotted line indicates the relation 20 minutes after ozone is dissolved. As can be seen from the graph, as the water temperature falls, the dissolved ozone concentration increases, and vice versa.

The ozone dissolved in water is decomposed with an elapse of time, or as shown by the dotted line 20 minutes after the dissolution, as the water temperature rises, the decomposition speed of ozone dissolved in water increases. Specifically, the effect as ozone water is rapidly lost with the rise of the water temperature. In forming a passive state film with ozone added water, a preferable range of water temperature thus exists.

The upper limit is 30° C., because exceeding 30° C. results in too fast decomposition speed of dissolved ozone, and formation of a passive state film will take too much time. The lower limit is 10° C., because under the temperature below 10° C., a slight change of the temperature causes a considerable change in the dissolved ozone concentration, that is, the dissolved ozone concentration depends on the temperature too much.

Although ozone is dissolved in pure water in this embodiment, it is also possible to dissolve oxygen. It is also possible to dissolve a mixture of ozone and oxygen. It is preferable to use ozone because ozone has oxidation power stronger than that of oxygen.

The reaction expression utilizing oxygen is the same as the above described expressions (1)–(5) except that $O_3$ is replaced with $O_2$.

Although aluminum is used as the base material of bonding pad 89 in this embodiment, it is also possible to use chromium (Cr), titanium (Ti), zirconium (Zr), tantalum (Ta), or the like.

The passive state film is of $Cr_2O_3$ in a case where chromium is used, $TiO_2$ in a case where titanium is used, $ZrO_2$ in a case where zirconium is used, and $Ta_2O_5$ in a case where tantalum is used.

Silicon substrate 71 on which passive state film 87 is formed is cut by dicing. Then, the cut silicon substrate is bonded on a die pad using solder, conductive resin, or the like.

Figure 12:
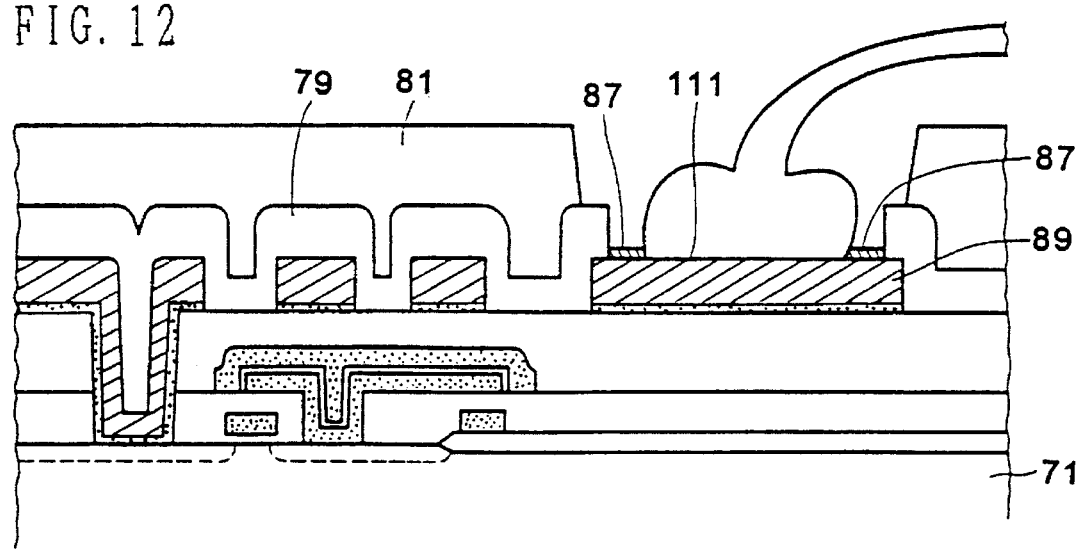
FIG. 12 is a cross sectional view for explaining a sixth step of the method of manufacturing the bonding pad part according to the first embodiment of the present invention.

Then, as illustrated in FIG. 12, a bonding wire 83 is bonded to main surface 111 of bonding pad 89 using thermo compression together with ultrasonic wave. Passive state film 87 between bonding wire 83 and main surface 111 is broken during bonding, and the broken passive state film is included in the alloy layers of bonding wire 83 and bonding pad 89.

Figure 13:
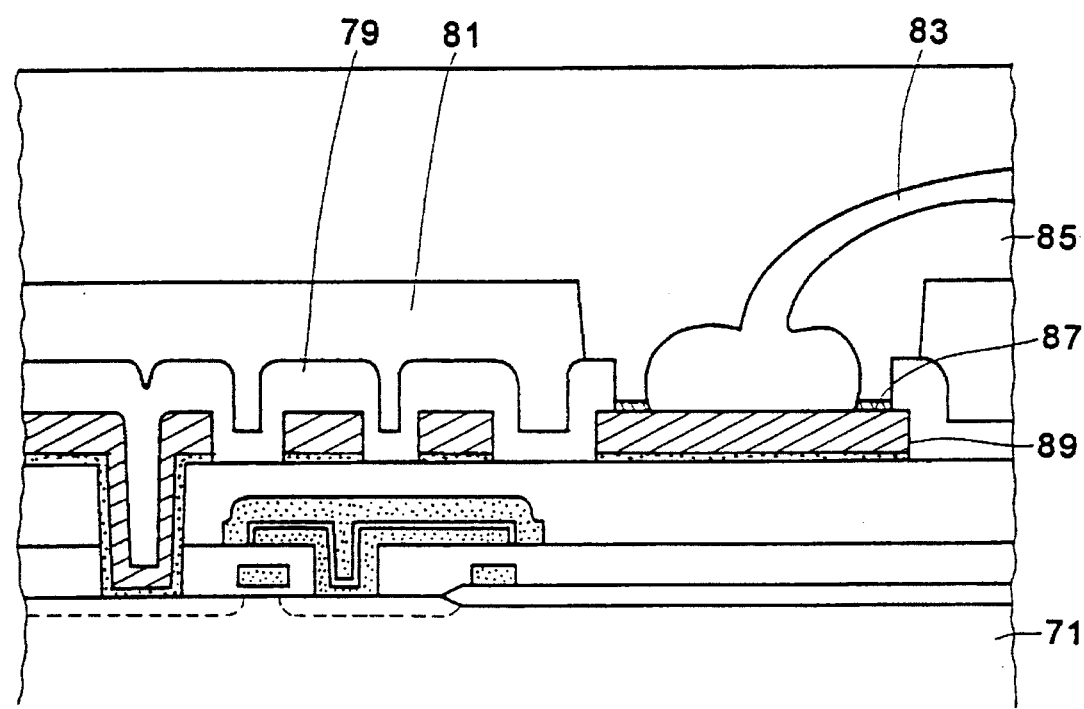
FIG. 13 is a cross sectional view for explaining an seventh step of the method of manufacturing the bonding pad part according to the first embodiment of the present invention.

As illustrated in FIG. 13, silicon substrate 71 is sealed with resin 85. As described above, the manufacturing process according to the first embodiment of the present invention is completed.

Figure 14:
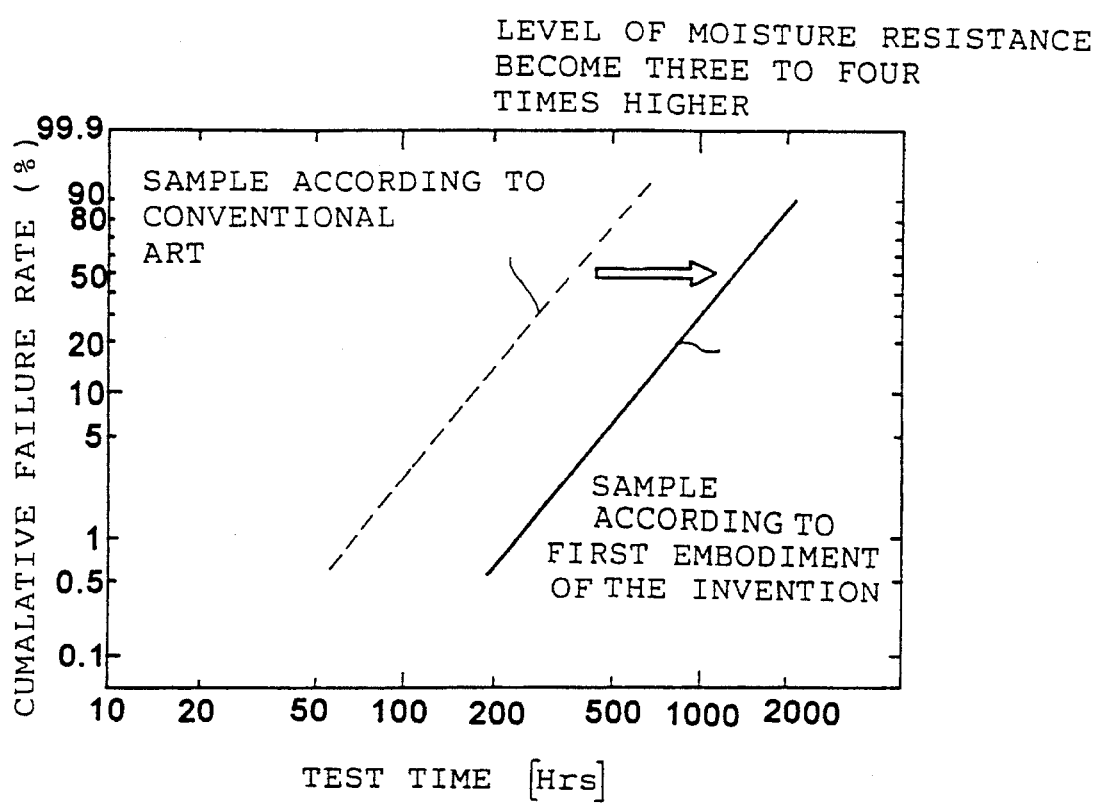
FIG. 14 is a graph showing the relation between the test time and the cumulative failure rate.

FIG. 14 is a graph showing the relation between the test time and the cumulative failure rate. The test time means the time of a moisture resistance test of a semiconductor device. The cumulative failure rate means a failure rate calculated as follows, for example: In a case where there are one hundred samples, and one failure is generated in the first 50 hours, and three failures are generated in the next 50 hours, it is calculated that four failures are generated within 100 hours.

A sample according to conventional art is a one in which a passive state film is formed without intention on a bonding pad formed of aluminum with Cu or the like added thereto. Specifically, a passive state film is formed unavoidably during a water washing step, which is one of the steps of a manufacturing process of a semiconductor device. Since this passive state film is formed without intention, it has a small thickness. If a passive state film is formed intentionally with warm water, it comes to be a film with a number of pinholes because of the local battery action. Therefore, a bonding pad on which a passive state film is formed without intention is more resistant to corrosion than a bonding pad on which a passive state film is formed using warm water. Accordingly, a semiconductor device provided with a bonding pad on which a passive film is formed without intention was used as a sample according to conventional art. As will be seen from FIG. 14, the time taken to reach a failure rate in the case of a sample according to the first embodiment of the present invention is three times to four times longer than the time taken to reach the same failure rate in the case of the sample according to the conventional art. Accordingly, it can be seen that, according to the first embodiment of the present invention, the moisture resistance is enhanced to be three times to four times higher than that in the case of the conventional art.

Figure 15:
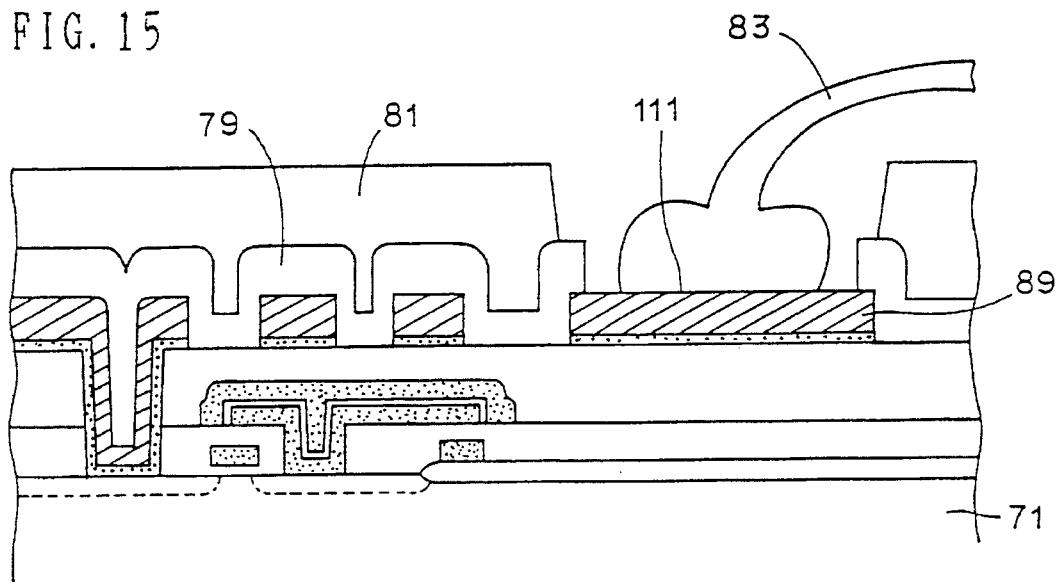
FIG. 15 is a cross sectional view showing a first step of the manufacturing method according to another example of the first embodiment of the present invention.
Figure 16:
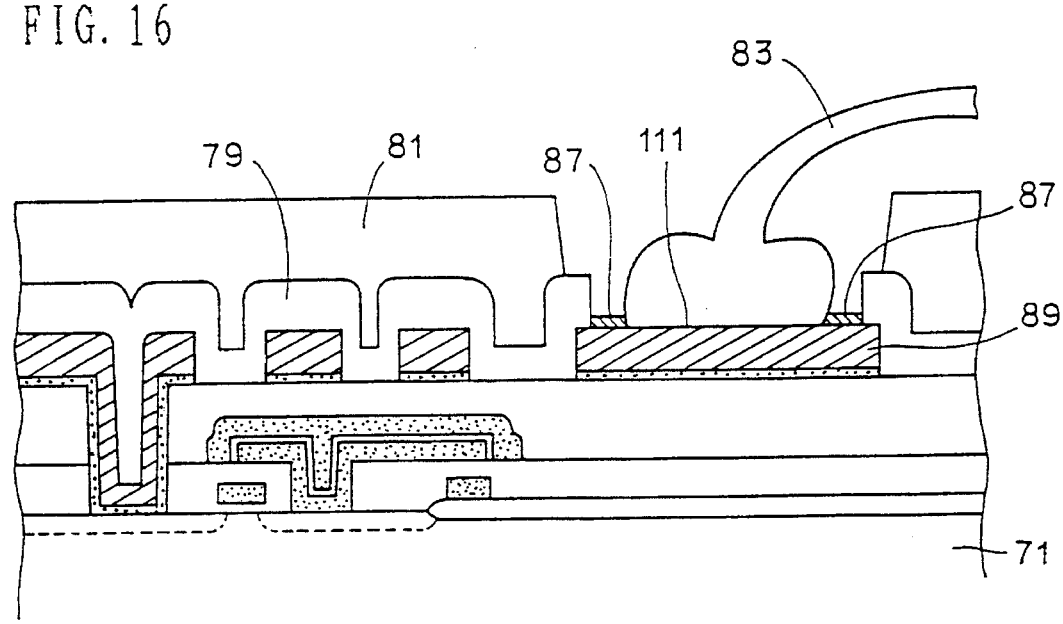
FIG. 16 is a cross sectional view showing a second step of the manufacturing method according to another example of the first embodiment of the present invention.

Although in the first embodiment shown in FIG. 8, bonding wire 83 is bonded to bonding pad 89 after formation of passive state film 87, passive state film 87 may be formed on bonding pad 89 after bonding wire 83 is bonded to bonding pad 89 as shown in FIGS. 15 and 16.

When passive state film 87 is formed after bonding wire 83 is bonded to bonding pad 89, the lower limit of the thickness of passive skate film 87 is approximately 50 Å because if it is less than 50 Å, the effect of preventing moisture invading the resin from reaching the bonding pad is reduced. In principle, higher upper limit of the thickness of passive state film 87 is more preferable. However, when passive state film 87 is formed in ozone added water, it is difficult to make the thickness of the passive state film thicker than 500 Å, because the passive state film itself acts as a barrier preventing oxidization and restricts the growth over a specified thickness.

When passive state film 87 is formed after bonding wire 83 is bonded to bonding pad 89, an exposed portion of bonding pad 89 can be completely covered with passive state film 87, so that a margin against corrosion of bonding pad 89 can be greatly enhanced.

When bonding wire 83 is bonded to bonding pad 89 after formation of passive state film 87 on bonding pad 89, passive state film 87 can be formed in the state of a semiconductor wafer, which enhances the productivity. Specifically, when passive state film 87 is formed after bonding wire 83 is bonded to bonding pad 89, passive state film 87 is formed in the state of a semiconductor chip having a wafer diced, which impairs the productivity.

FIG. 17 (*a*) shows a partial cross sectional view of a semiconductor device according to a second embodiment of the present invention, and (*b*) is a plan view of bonding pad 89. In the first embodiment of FIG. 1, the electrical connection between bonding pad 89 and a first wiring film 77 is not shown, while the connection is shown in the second embodiment of FIG. 17. The explanation is not repeated, since the second embodiment is similar to the first embodiment shown in FIG. 1 except that the electrical connection between bonding pad 89 and first wiring film 77 is shown in the second embodiment.

FIG. 18 is a partial cross sectional view of a semiconductor device according to a third embodiment of the present invention. If it is a device which is not susceptible to effects of the stress due to sealing with resin, it is unnecessary to form buffer coat film 81 (See FIG. 1.). The components which are the same as components denoted by reference numerals in FIG. 1 are given the same reference numerals.

Figure 19:
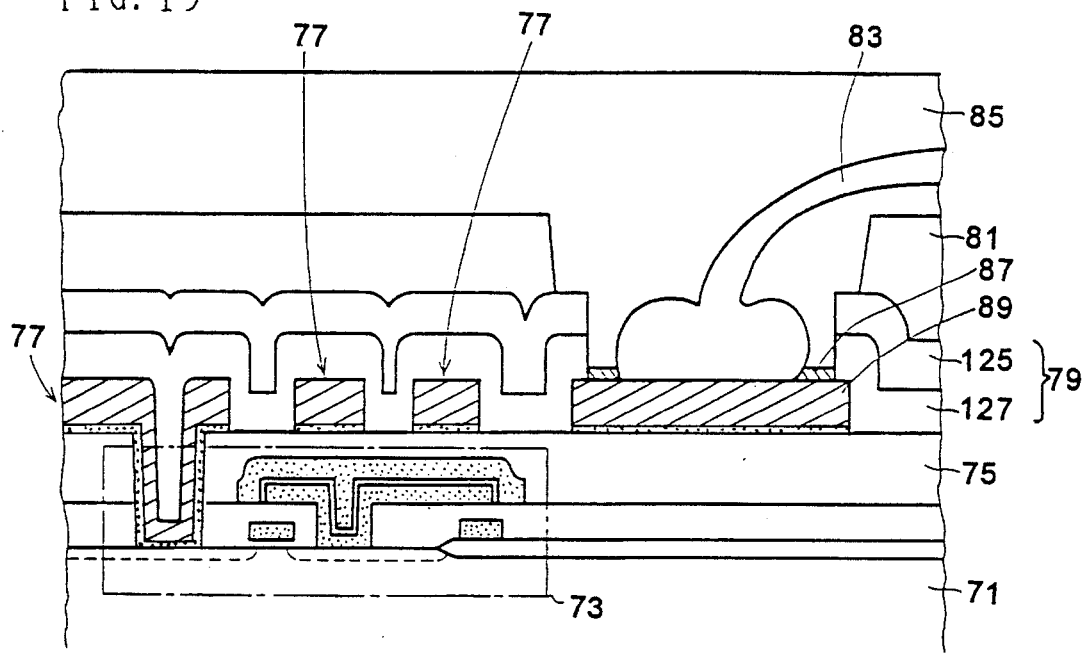
FIG. 19 is a partial cross sectional view of a semiconductor device according to a fourth embodiment of the present invention.

FIG. 19 is a partial cross sectional view of a semiconductor device according to a fourth embodiment of the present invention. Although surface protecting film 79 is of a monolayer structure according to the first embodiment as illustrated in FIG. 1, surface protecting film 79 may also be of a multilayer structure including silicon oxide film 127 and silicon nitride film 125 as illustrated in FIG. 19.

Figure 20:
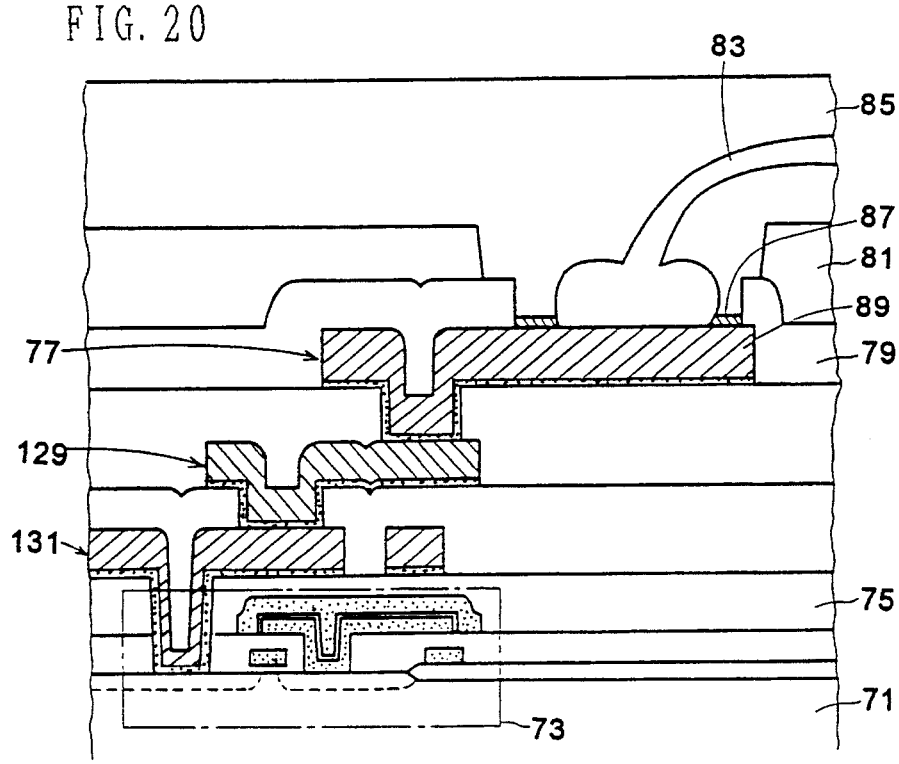
FIG. 20 is a partial cross sectional view of a semiconductor device according to a fifth embodiment of the present invention.

FIG. 20 is a partial cross sectional view of a semiconductor device according to a fifth embodiment of the present invention. According to this embodiment, interconnection is of a three-layer structure including a first interconnection film 77, a second interconnection film 129, and a third interconnection film 131. First interconnection film 77 and second interconnection film 129 are formed of an aluminum alloy. Third interconnection film 131 is formed of a refractory metal (W, Mo, Ti, etc.), a refractory metal silicide ($WSi_2$, $MoSi_2$, $TiSi_2$, etc.), or polycrystalline silicon. The components which are the same as components denoted by reference numerals in FIG. 1 are given the same reference numerals.

Figure 21:
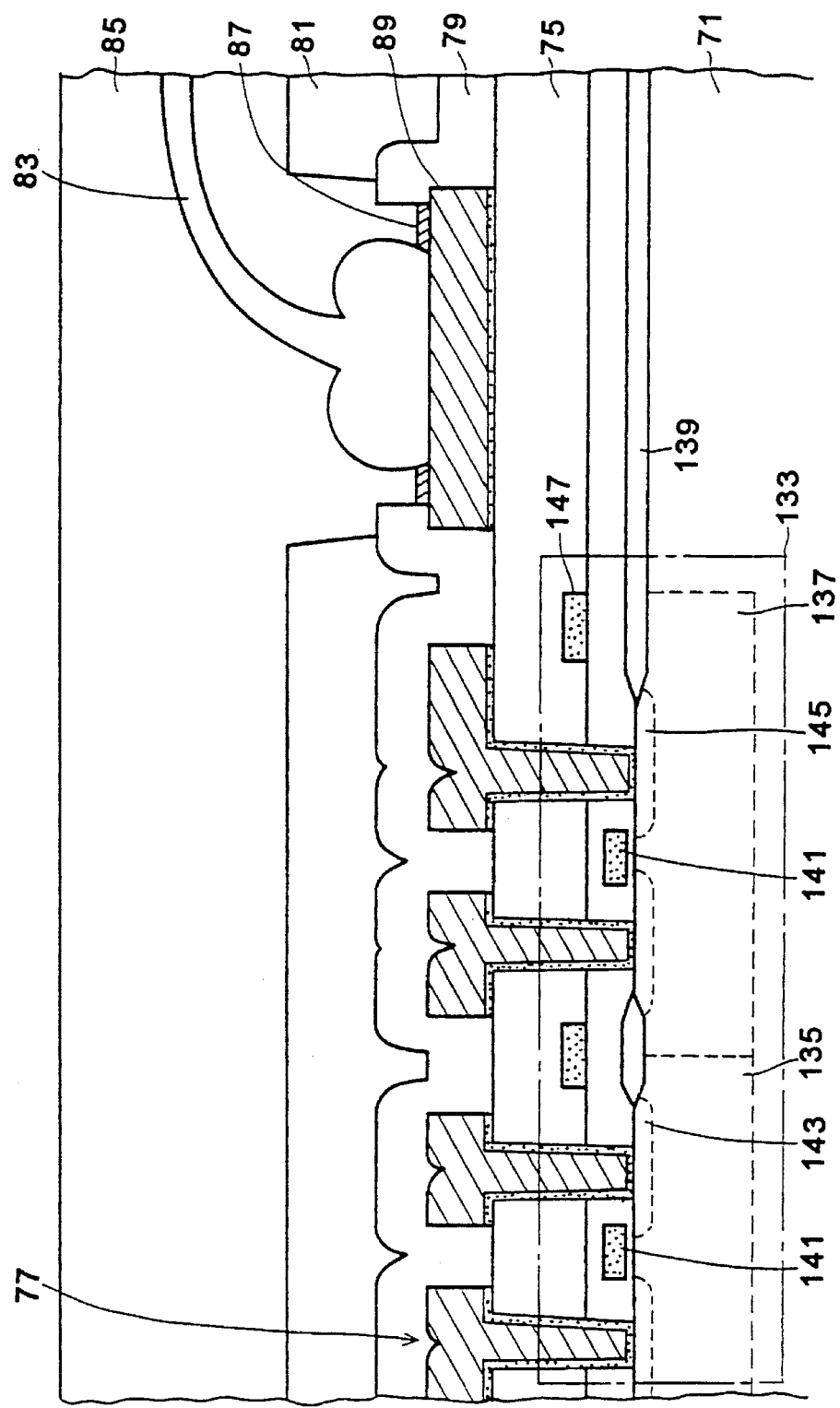
FIG. 21 is a partial cross sectional view of a semiconductor device according to a sixth embodiment of the present invention.

FIG. 21 is a partial cross sectional view of a semiconductor device according to a fifth embodiment of the present invention. Although DRAM element 73 is formed on silicon substrate 71 according to the first embodiment as illustrated in FIG. 1, a SRAM (Static Random Access Memory) element 133 is formed on a silicon substrate 71 according to the sixth embodiment.

SRAM element 133 will be described in detail. SRAM element 133 is of a double-well structure including a P-type well 135 and an N-type well 137. An N-type impurity diffused layer 143 is formed in P-type well 135. A P-type impurity diffused layer 145 is formed in N-type well 137. Reference numeral 141 denotes a gate electrode, reference numeral 139 denotes an element isolating oxide film, and reference numeral 147 denotes a polycrystalline silicon interconnection film. The components which are the same as components denoted by reference numerals in FIG. 1 are given the same reference numerals.

It is also possible to use an EPROM (Erasable Programmable Read Only Memory) element, EEPROM (Electrical Erasable Programmable ROM) element, a microcomputer circuit element, a CMOS (Complementary Metal Oxide Semiconductor) logic circuit element, or a bipolar transistor element in place of a DRAM element or a SRAM element.

Figure 22:
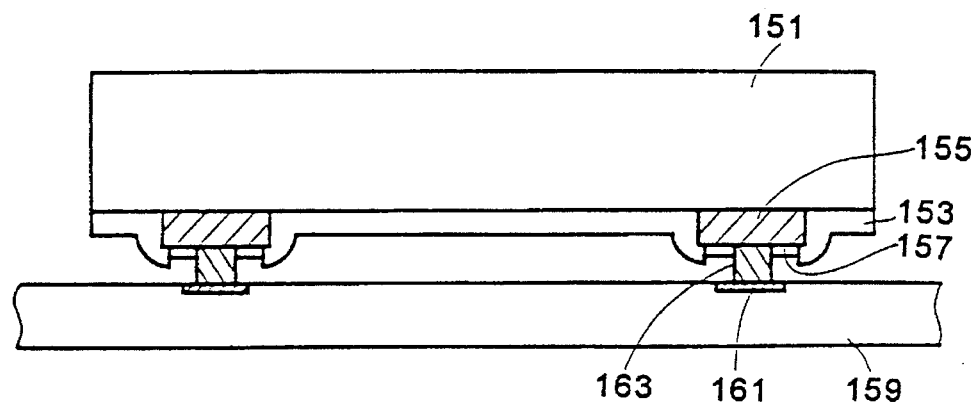
FIG. 22 is a typical view of a semiconductor device according to a seventh embodiment of the present invention.
Figure 23:
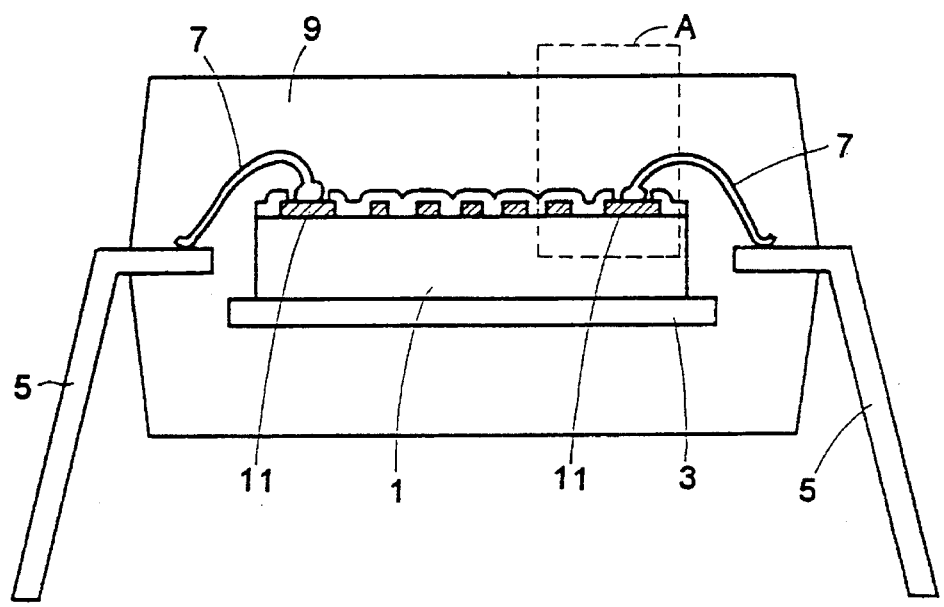
FIG. 23 is a typical view of a semiconductor device in which wire bonding is performed.
Figure 24:
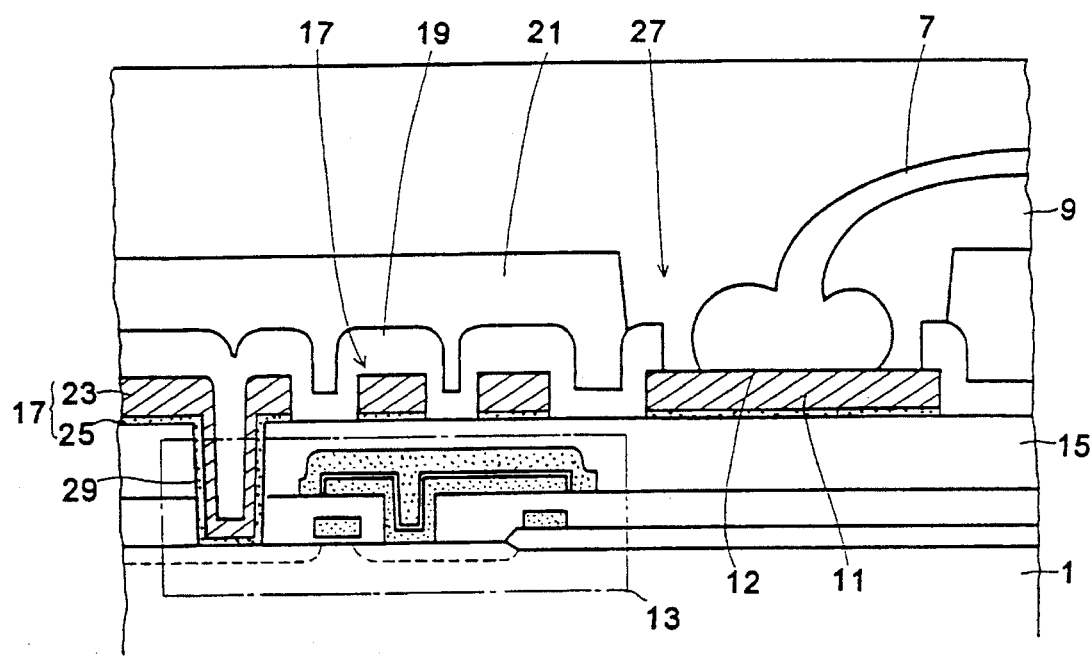
FIG. 24 is an enlarged cross sectional view of a part A of the semiconductor device in FIG. 23.
Figure 25:
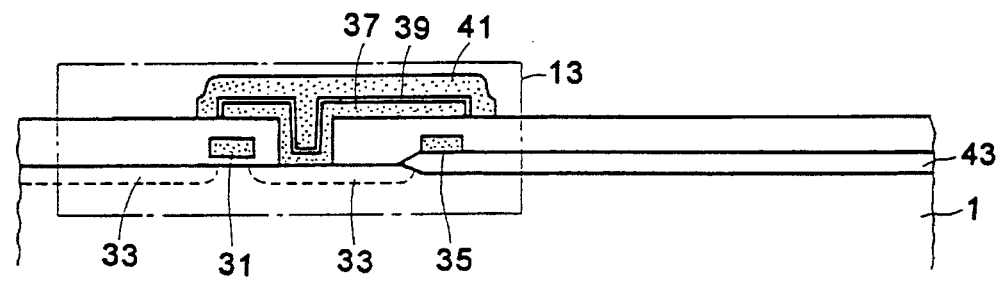
FIG. 25 is a cross sectional view for explaining a first step of a method of manufacturing a conventional bonding pad part.
Figure 26:
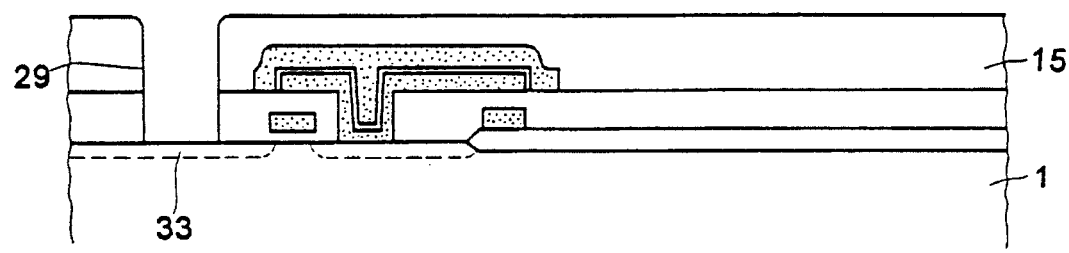
FIG. 26 is a cross sectional view for explaining a second step of the method of manufacturing the conventional bonding pad part.
Figure 27:
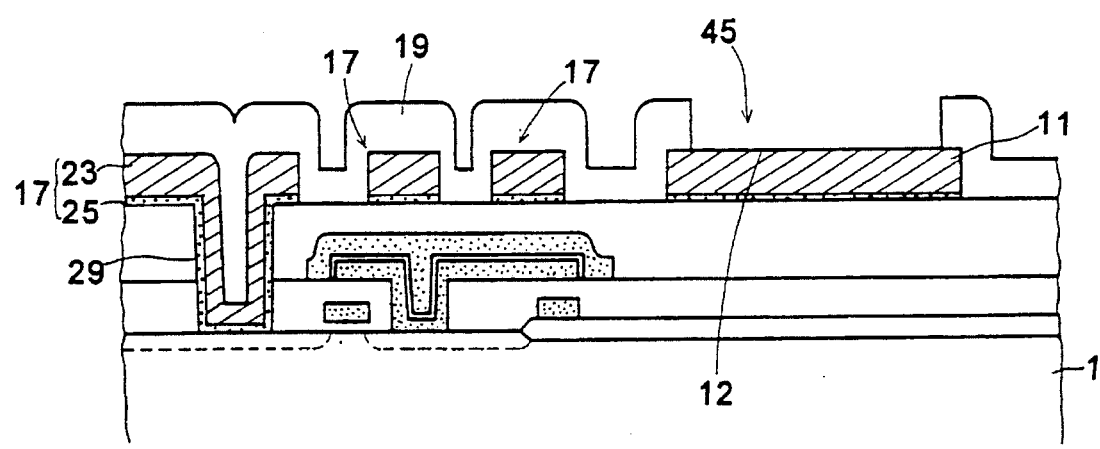
FIG. 27 is a cross sectional view for explaining a third step of the method of manufacturing the conventional bonding pad part.
Figure 28:
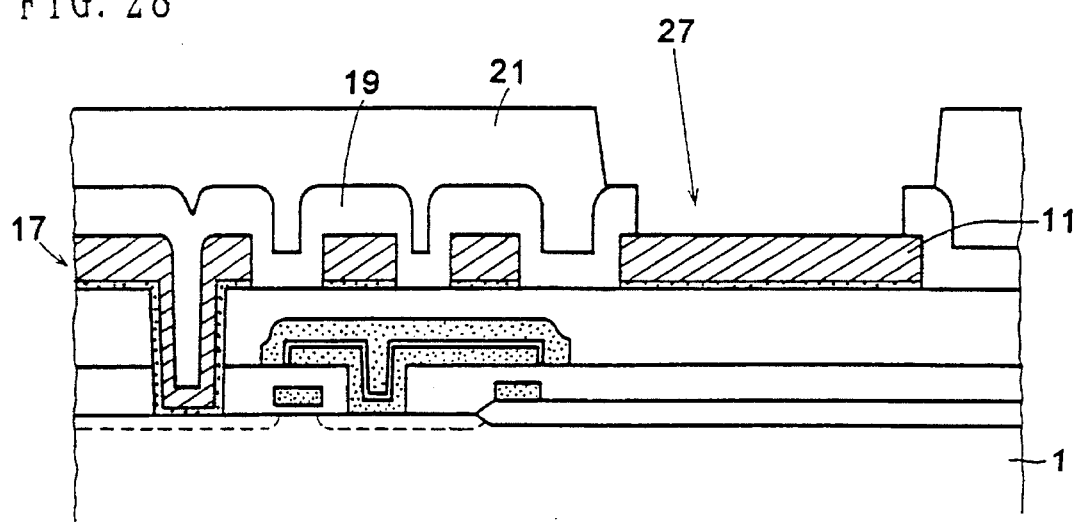
FIG. 28 is a cross sectional view for explaining a fourth step of the method of manufacturing the conventional bonding pad part.
Figure 29:
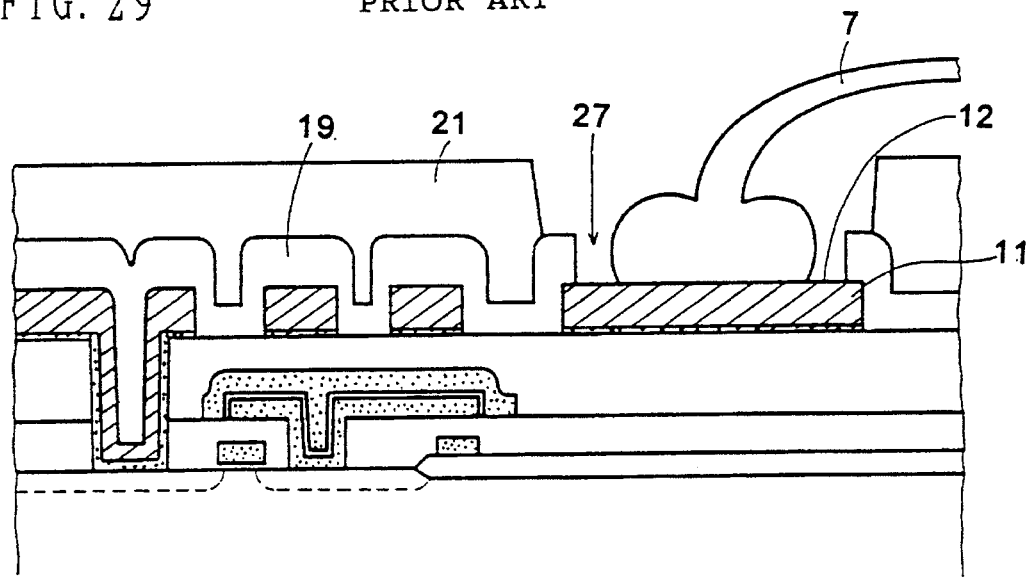
FIG. 29 is a cross sectional view for explaining a fifth step of the method of manufacturing the conventional bonding pad part.
Figure 30:
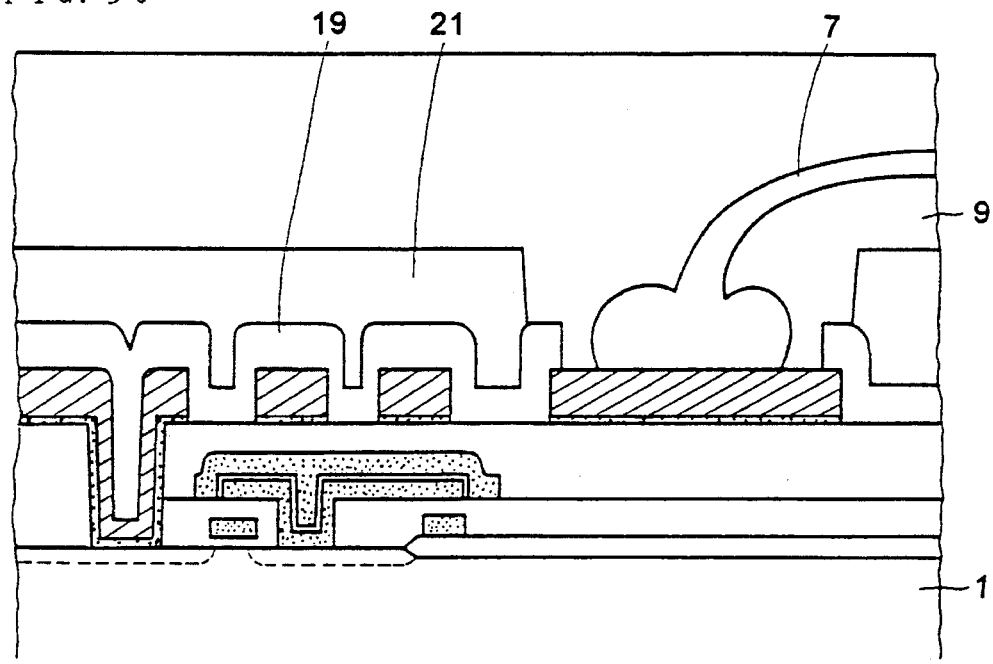
FIG. 30 is a cross sectional view for explaining a sixth step of the method of manufacturing the conventional bonding pad part.
Figure 31:
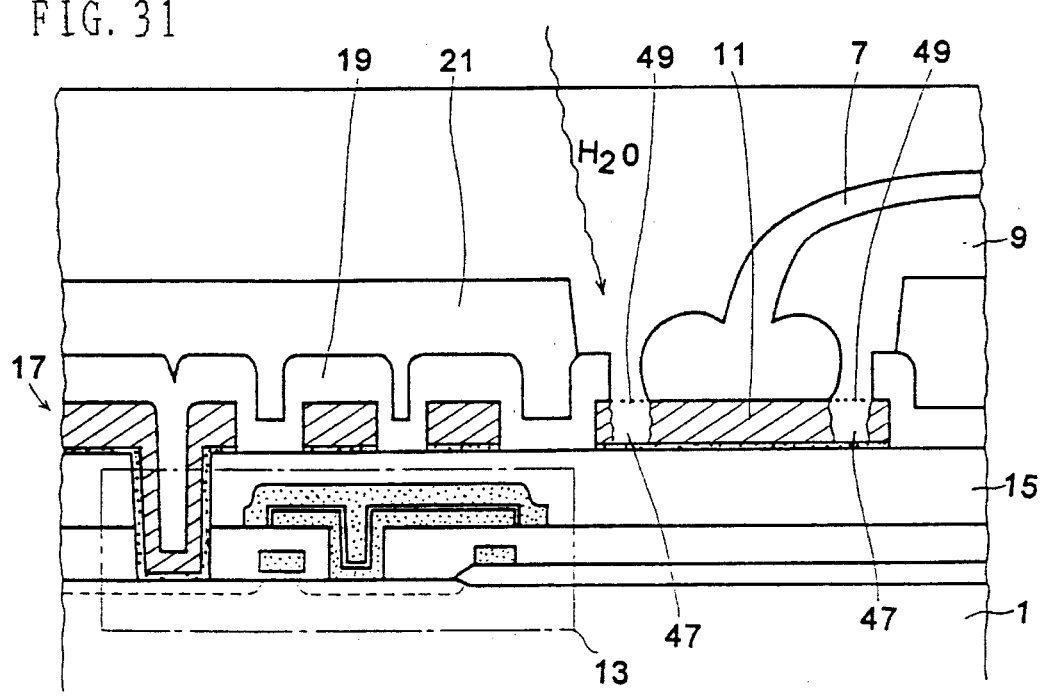
FIG. 31 is a cross sectional view for explaining a problem of the method of manufacturing the conventional bonding pad part.
Figure 32:
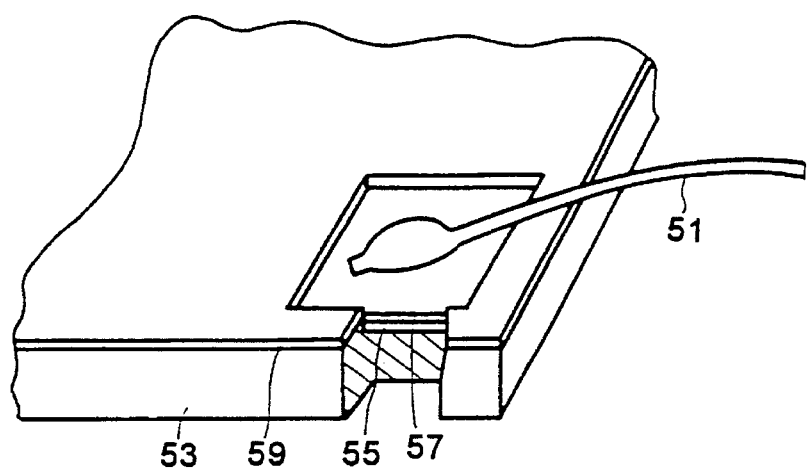
FIG. 32 is a perspective view of a bonding pad part disclosed in Japanese Patent Laying-Open No. 63-269541 (1988).
Figure 33:
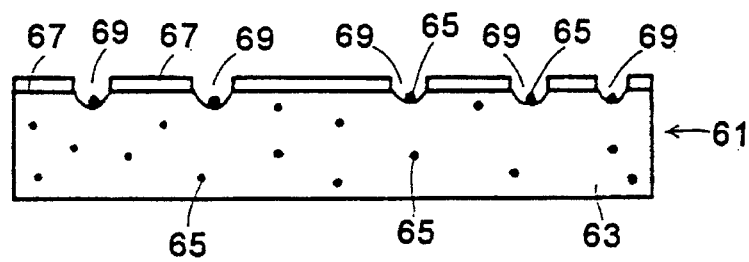
FIG. 33 is a typical view illustrating a bonding pad in which a number of pinholes are generated in a passive state film.
Figure 34:
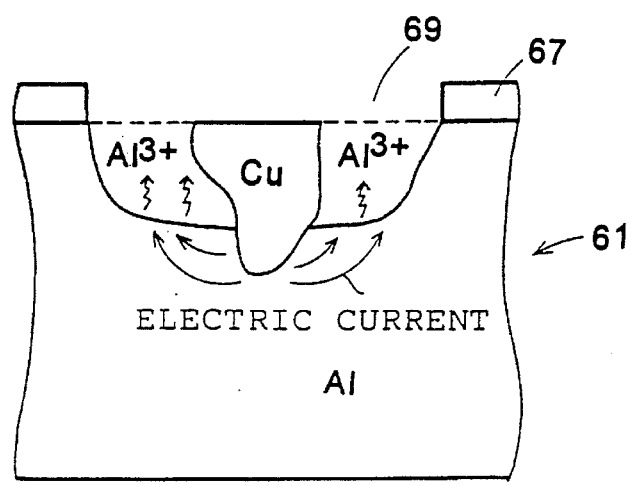
FIG. 34 is a typical view for explaining a local battery action.

FIG. 22 is a typical view of a semiconductor device according to a seventh embodiment of the present invention. According to the seventh embodiment, connection between a bonding pad 155 and wiring 161 formed on a substrate 159 is established using a columnar electrode 163 formed on bonding pad 155. Columnar electrode 163 is of aluminum or the like and formed on bonding pad 155 by a sputtering method or the like. Reference numeral 151 denotes a silicon substrate, reference numeral 153 denotes a surface protecting film, and reference numeral 157 denotes a passive state film.

According to an aspect of the present invention, it is possible to make the speed of formation of a passive state film higher than the speed of fusion of aluminum, so that it is possible to provide a semiconductor device including a bonding pad having a passive state film with no pinholes.

According to another aspect of the present invention, a semiconductor device is manufactured using the above-described aspect of the present invention, so that it is possible to make the thickness of a passive state film be in the range of 50 Å to 200 Å even on a bonding pad including a metal added thereto for enhancing the resistance to electromigration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device including a bonding pad having a main surface electrically connected to external wiring, comprising the steps of:

forming said bonding pad on a semiconductor substrate;

forming a surface protecting film on said semiconductor substrate having a hole to expose said main surface; and immersing said semiconductor substrate in solution supplied with at least one of $O_3$ and $O_2$ to form a passive state film on said main surface, wherein said solution is a liquid having said at least one of $O_3$ and $O_2$ dissolved therein, said solution at a temperature of between 0° C. and 50° C.

2. The method of manufacturing a semiconductor device according to claim 1, wherein said bonding pad contains a metal for enhancing the resistance to electromigration.

3. The method of manufacturing a semiconductor device according to claim 2, wherein said bonding pad is aluminum or an aluminum alloy and said metal includes at least one material selected from the group consisting of copper, titanium, chromium, magnesium, scandium, yttrium, zirconium, hafnium, vanadium, niobium, tantalum, molybdenum, tungsten and palladium.

4. The method of manufacturing a semiconductor device according to claim 1, wherein said at least one of $O_3$ and $O_2$ dissolved in said solution is maintained in a range of 1 mg/liter to 10 mg/liter.

5. The method of manufacturing a semiconductor device according to claim 1, wherein said bonding pad has a base material selected from the group consisting of aluminum, chromium, titanium, zirconium, and tantalum.

6. The method of manufacturing a semiconductor device according to claim 5, wherein said passive state film includes at least one material selected from the group consisting of aluminum oxide, chromium oxide, titanium oxide, zirconium oxide, and tantalum oxide.

7. The method of manufacturing a semiconductor device according to claim 1, further comprising the step of bonding a wire to said main surface, after formation of said passive state film.

8. The method of manufacturing a semiconductor device according to claim 1, further comprising the step of bonding a wire to said main surface, after said step of forming said surface protecting film and prior to said step of forming said passive state film.

9. The method of manufacturing a semiconductor device according to claim 1, further comprising the step of, after said step of forming said surface protecting film and prior to said step of forming said passive state film, forming an electrode for said electrical connection to said external wiring.

10. The method of manufacturing a semiconductor device according to claim 1, wherein the thickness of said passive state film is in the range of 50 Å to 200 Å.

11. The method of manufacturing a semiconductor device according to claim 1, wherein said bonding pad is formed at the same time as an interconnection film is electrically connected to a semiconductor element.

12. A method of manufacturing a semiconductor device including a bonding pad having a main surface with a conductor attached thereto comprising the steps of:

forming said bonding pad on a semiconductor substrate;

regulating a flow of at least one of $O_3$ and $O_2$;

dissolving said at least one of $O_3$ and $O_2$ in a quantity of solution;

immersing said semiconductor substrate in said quantity of solution having said at least one of $O_3$ $O_2$ dissolved therein, wherein said solution is a liquid having said at least one of $O_3$ and $O_2$ dissolved therein, said solution at a temperature of between 0° C. and 50° C.; and attaching said conductor to said bonding pad.

13. The method of manufacturing a semiconductor device according to claim 12, wherein said conductor is a bonding wire.

14. The method of manufacturing a semiconductor device according to claim 12, wherein said conductor is an electrode for wireless bonding.

15. The method of manufacturing a semiconductor device according to claim 12, wherein the concentration of said at least one of $O_3$ and $O_2$ dissolved in said solution is maintained within a range.

16. The method of manufacturing a semiconductor device according to claim 15, wherein the concentration of said at least one of $O_3$ and $O_2$ dissolved in said solution is measured by a sensor, and based on said measured concentration, the concentration of said one of at least $O_3$ and $O_2$ dissolved in said solution is maintained within said range.

17. A method of manufacturing a semiconductor device including a bonding pad having a main surface electrically connected to external wiring, comprising the steps of:

forming said bonding pad on a semiconductor substrate;

forming a surface protecting film on said semiconductor substrate having a hole to expose said main surface; and forming a passive state film on said main surface by immersing said semiconductor substrate in solution supplied with at least one of $O_3$ and $O_2$ wherein said solution is a liquid having said at least one of $O_3$ and $O_2$ dissolved therein, said solution at a temperature of between 0° C. and 50° C.; and bonding a wire to said main surface.

18. The method of manufacturing a semiconductor device according to claim 17, wherein the thickness of said passive state film is in the range of 50 Å to 200 Å.

19. The method of manufacturing a semiconductor device according to claim 17, wherein said bonding pad is aluminum or an aluminum alloy and said bonding pad contains a metal for enhancing the resistance for electromigration, said metal includes at least one material selected from the group consisting of copper, titanium, chromium, magnesium, scandium, yttrium, zirconium, hafnium, vanadium, niobium, tantalum, molybdenum, tungsten and palladium.

20. The method of manufacturing a semiconductor device according to claim 15 wherein said range is between about 1 mg/liter and 10 mg/liter.

* * * * *